(12) United States Patent
Siepe et al.

(10) Patent No.: US 9,196,562 B2
(45) Date of Patent: Nov. 24, 2015

(54) SEMICONDUCTOR ARRANGEMENT, SEMICONDUCTOR MODULE, AND METHOD FOR CONNECTING A SEMICONDUCTOR CHIP TO A CERAMIC SUBSTRATE

(75) Inventors: Dirk Siepe, Warstein (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 412 days.

(21) Appl. No.: 13/226,981

(22) Filed: Sep. 7, 2011

(65) Prior Publication Data
US 2011/0316160 A1 Dec. 29, 2011

Related U.S. Application Data

(63) Continuation of application No. 11/551,488, filed on Oct. 20, 2006, now Pat. No. 8,164,176.

(51) Int. Cl.
*H01L 23/15* (2006.01)
*H01L 23/373* (2006.01)
(Continued)

(52) U.S. Cl.
CPC ............ *H01L 23/3735* (2013.01); *H01L 24/03* (2013.01); *H01L 24/05* (2013.01); *H01L 24/32* (2013.01); *H01L 24/33* (2013.01); *H01L 24/48* (2013.01); *H01L 24/49* (2013.01); *H01L 24/78* (2013.01); *H01L 24/85* (2013.01); *H01L 24/45* (2013.01); *H01L 24/83* (2013.01); *H01L 25/072* (2013.01); *H01L 2224/04042* (2013.01); *H01L 2224/05082* (2013.01); *H01L 2224/05171* (2013.01); *H01L 2224/05172* (2013.01); *H01L 2224/05181* (2013.01); *H01L 2224/05184* (2013.01); *H01L 2224/05647* (2013.01); *H01L 2224/05666* (2013.01); *H01L 2224/32225* (2013.01); *H01L 2224/32245* (2013.01); *H01L 2224/45014* (2013.01); *H01L 2224/45015* (2013.01); *H01L 2224/45124* (2013.01); *H01L 2224/45147* (2013.01);
(Continued)

(58) Field of Classification Search
CPC .......... H01L 2224/48227; H01L 2224/73265; H01L 2924/01029; H01L 2224/45014; H01L 2224/04042
USPC .......................................... 257/703, 700, 701
See application file for complete search history.

(56) References Cited

U.S. PATENT DOCUMENTS 5,272,376 A 12/1993 Ueno
5,557,842 A * 9/1996 Bailey .............................. 29/827
(Continued)

FOREIGN PATENT DOCUMENTS

DE 10205609 A1 8/2003
DE 102004021927 A1 12/2005
(Continued)

*Primary Examiner* — Howard Weiss
*Assistant Examiner* — Tifney Skyles
(74) *Attorney, Agent, or Firm* — Murphy, Bilak & Homiller, PLLC

(57) ABSTRACT

A semiconductor arrangement includes a silicon body having a top surface and a bottom surface, and a thick metal layer arranged on the top surface of the silicon body. The thick metal layer has a bonding surface facing away from the top surface of the silicon body. A bonding wire or a ribbon is bonded to the thick metal layer at the bonding surface of the thick metal layer. The thickness of the thick metal layer is at least 10 micrometers (μm), the thick metal layer comprises copper or a copper alloy, and the bonding wire or ribbon comprises copper or a copper-based material.

15 Claims, 4 Drawing Sheets

(51) Int. Cl.
*H01L 23/00* (2006.01)
*H01L 25/07* (2006.01)
(52) U.S. Cl.
CPC ........... *H01L 2224/48091* (2013.01); *H01L 2224/48227* (2013.01); *H01L 2224/48247* (2013.01); *H01L 2224/48472* (2013.01); *H01L 2224/48491* (2013.01); *H01L 2224/48747* (2013.01); *H01L 2224/48766* (2013.01); *H01L 2224/48847* (2013.01); *H01L 2224/48866* (2013.01); *H01L 2224/49* (2013.01); *H01L 2224/73265* (2013.01); *H01L 2224/78313* (2013.01); *H01L 2224/8383* (2013.01); *H01L 2224/8384* (2013.01); *H01L 2224/83801* (2013.01); *H01L 2224/8501* (2013.01); *H01L 2224/85205* (2013.01); *H01L 2924/01002* (2013.01); *H01L 2924/014* (2013.01); *H01L 2924/0104* (2013.01); *H01L 2924/01005* (2013.01); *H01L 2924/0105* (2013.01); *H01L 2924/01006* (2013.01); *H01L 2924/0106* (2013.01); *H01L 2924/0107* (2013.01); *H01L 2924/01013* (2013.01); *H01L 2924/01014* (2013.01); *H01L 2924/01015* (2013.01); *H01L 2924/01019* (2013.01); *H01L 2924/01022* (2013.01); *H01L 2924/01028* (2013.01); *H01L 2924/01029* (2013.01); *H01L 2924/01033* (2013.01); *H01L 2924/01041* (2013.01); *H01L 2924/01068* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/04953* (2013.01); *H01L 2924/05042* (2013.01); *H01L 2924/10253* (2013.01); *H01L 2924/13055* (2013.01); *H01L 2924/15787* (2013.01); *H01L 2924/2076* (2013.01)

(56) References Cited

U.S. PATENT DOCUMENTS

| | | | |
|---|---|---|---|
| 6,261,703 B1* | 7/2001 | Sasaki et al. | 428/627 |
| 6,365,965 B1 | 4/2002 | Jeun | |
| 2003/0102563 A1 | 6/2003 | Mercado et al. | |
| 2006/0022311 A1* | 2/2006 | Lin | 257/649 |
| 2007/0138628 A1* | 6/2007 | Lam | 257/723 |

FOREIGN PATENT DOCUMENTS

| | | |
|---|---|---|
| DE | 102005047566 A1 | 4/2007 |
| DE | 112005001296 B4 | 8/2012 |
| EP | 0723291 A2 | 7/1996 |

* cited by examiner

SEMICONDUCTOR ARRANGEMENT, SEMICONDUCTOR MODULE, AND METHOD FOR CONNECTING A SEMICONDUCTOR CHIP TO A CERAMIC SUBSTRATE

PRIORITY CLAIM

This application is a continuation of U.S. application Ser. No. 11/551,488 filed on 20 Oct. 2006, the content of said application being incorporated herein by reference in its entirety.

TECHNICAL FIELD

The present invention relates generally semiconductor arrangements and in particular to semiconductor modules, and to methods for connecting a semiconductor chip to a ceramic substrate.

BACKGROUND

Within semiconductor modules one or more semiconductor chips are arranged on a substrate, and one or more substrates are arranged on a base plate, which can be part of the housing of the module. In conventional semiconductor modules the chips are soldered to the substrate with their bottom-side and the top-side of the chips is connected to the substrate by the use of bonding wires. For the bonding-wires aluminum-wires are commonly used, but when incorporated in power semiconductor modules aluminum wires exhibit certain disadvantages due to the cyclic thermo-mechanical load immanent in power electronic devices. Cyclic thermo-mechanical stress leads to crack propagation in aluminum bonding-wires and to bonding-wire lift-off defects. Common aluminum-wires cannot simply be replaced by wires made of another material, e. g. copper. Most alternative metals are harder than aluminum and active cells can be damaged while bonding with wires made of materials other than aluminum. Consequently there is a need for an innovative integral solution which allows the replacement of common aluminum bonding-wires for the above-mentioned draw-backs.

SUMMARY

In one embodiment, a semiconductor arrangement may comprise a silicon body having a first surface and a second surface and a thick metal layer arranged on at least one surface of the silicon body, wherein the thickness of the thick metal-layer is at least 10 micrometers (μm).

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

In one embodiment, a semiconductor arrangement may comprises a silicon body having a first surface and a second surface a thin adhesion layer deposited on at least one of the surfaces of the silicon body; and a thick metal layer deposited on the thin adhesion layer for bonding thick bonding wires onto the thick metal layer.

In another embodiment, a semiconductor module may comprise a ceramic substrate with a first and a second surface, the substrate having a thick metallization made of copper or its alloys at least at one of the surfaces; a semiconductor chip comprising a silicon body having a first surface and a second surface, a thin adhesion layer deposited on at least one of the surfaces of the silicon body, and a thick metal layer deposited on the thin layer for bonding thick bonding wires onto the thick metal layer, the semiconductor chip being arranged on the substrate; and a copper-wire-bond connecting the thick metal layer of the semiconductor chip with the thick metallization of the ceramic substrate.

Further, in another embodiment, a method for connecting a thick metal layer on a semiconductor chip to a thick metallization made of copper or its alloys on a ceramic substrate is disclosed, may comprise the step of bonding thick copper wires or ribbons to the thick metal layer and the thick metallization using a bonding tool with a surface which ensures enough grip between wire and tool during ultrasonic bonding, e.g. with a surface having a micro porous coating.

In other embodiments, the method for connecting a thick metal layer on a semiconductor chip to a thick metal plating made of copper or its alloys on a ceramic substrate, may alternatively or additionally comprise the step of bonding thick copper wires or ribbons to the thick metal layer and the thick metallization using a bonding tool with a protrusion structure or waffle structure.

Figure 1:
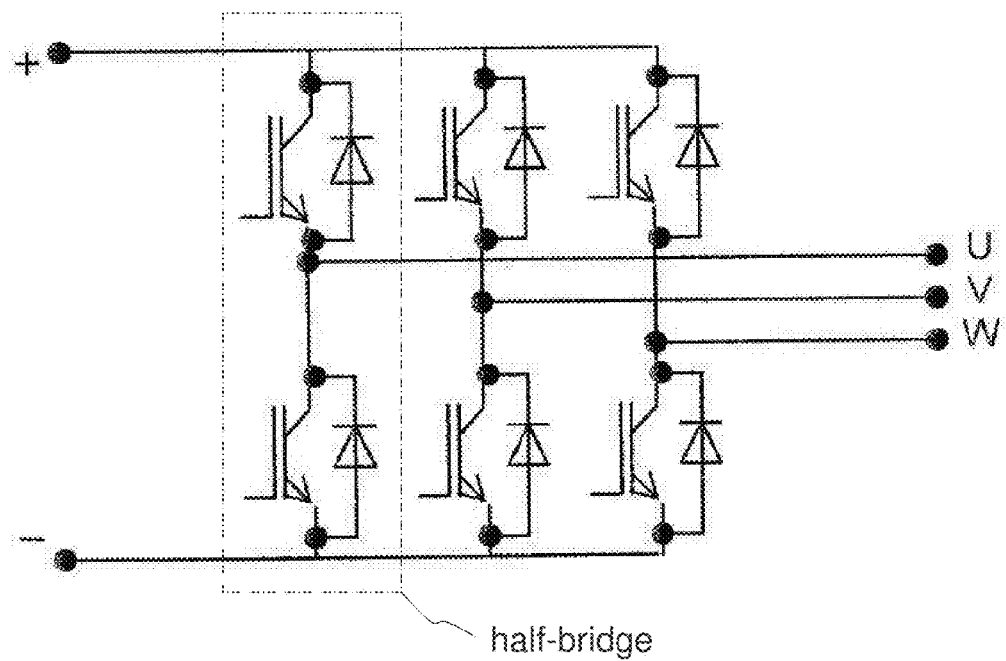
FIG. 1 shows an exemplary circuit which can be integrated and mounted into a semiconductor module using a thick-metal-layer and a bonding method according to the invention.

In some embodiments, power electronic circuits such as pulse width modulator (PWM) inverters, converters, etc. are commonly arranged in power semiconductor modules which comprise at least one power semiconductor switch and an anti-parallel freewheeling diode. FIG. 1 shows a three phase IGBT inverter as one of many examples for an electronic circuit arranged in a power semiconductor module. Driver circuits can also be integrated in such modules which are called, in this case, "intelligent power modules" (IPM).

In conventional power semiconductor modules, the semiconductor chips 11 inside are assembled on a substrate which comprises an insulating plate 15 with a metallization layer 16 at least on the top side of the insulating plate 15 onto which the power semiconductor chips 11 are assembled. The metallization layer 16 can be structured according to the circuit requirements. The semiconductor chips 11 can be soldered to the metallization 16 such that a solder layer 13 provides an electrical and thermal connection between the bottom side of the power semiconductor chip 11 and the metallization layer 16. The top side of the semiconductor chip 11 and the metallization 16 is connected by a bonding wire 12. With common semiconductor devices aluminum bonding wires are used.

In some embodiments, one ore more substrates 15, 16 are assembled on a base plate 17 to allow for an excellent heat transfer to a heat sink 18. The insulating plate 15, therefore, comprises another metallization layer 16 on its bottom surface which is connected to the base plate 17 by a solder layer 14. The base plate is, in turn, mounted onto a heat sink.

In other embodiments, different ceramic materials (e.g. $Al_2O_3$, AlN, $Si_3N_4$) can be used as insulating plates 15 and copper or aluminum is usually used to form the metallization layers 16 by a DCB-, AMB-, DAB- or a regular brazing method, wherein DCB stands for Direct Copper Bonding, AMB for Active Metal Brazing and DAB for Direct Aluminum Bonding. The thickness of the metallization layer ranges from 0.1 mm to 0.6 mm, ceramic thickness of the insulating plate 16 from 0.2 mm to 2 mm. If—as mentioned above—the sub-strate is soldered to a base plate 17, copper (or aluminum) metallization is applied on both sides of the insulating plate 16. Depending on the application, the metallization layers 16 can also be nickel or nickel plated with gold. If the metallization 16 is aluminum, plating is a requirement in case of soldering.

Figure 2:
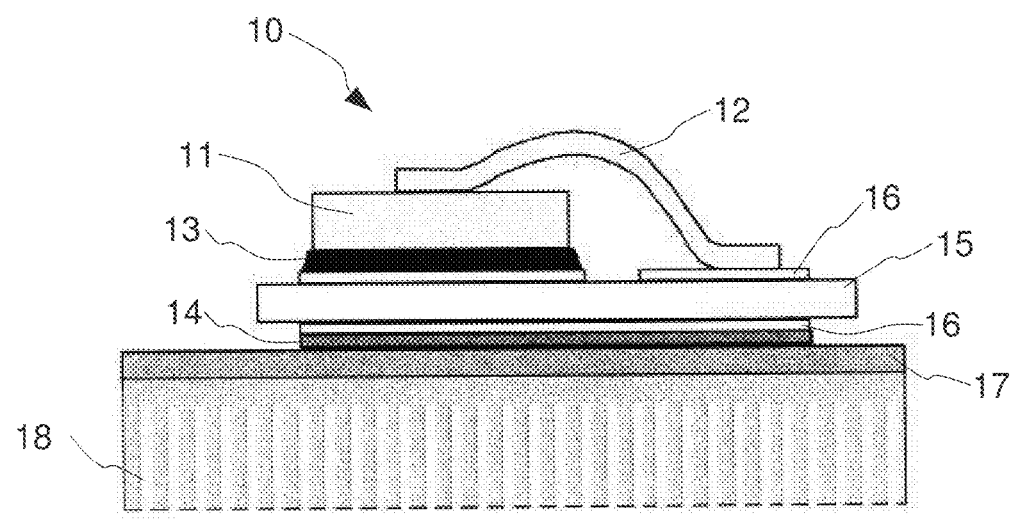
FIG. 2 shows a semiconductor device soldered to a substrate and bonded using common aluminum wires.
Figure 3:
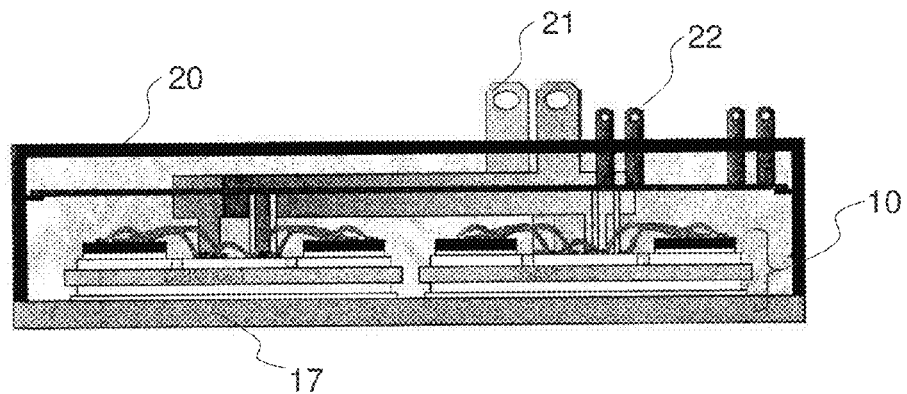
FIG. 3 shows several semiconductor devices mounted on different substrates arranged in a single semiconductor module.

FIG. 3 shows embodiments of several semiconductor devices 10 (as depicted in FIG. 2) assembled on a single base plate 17 which is used as a bottom-cap of a housing 20 made—as usual—of plastics. Power terminals 21 and auxiliary terminals 22 are usually fed to the top of the housing 20 by copper leads. Inside the housing 20 the terminals 21 and 22 are connected to pads arranged in the metallization layer 16 on the semiconductor devices 10. Interconnection to the inner metallization pads may be done by soldering, welding, ultrasonic wire bonding, etc. Outside the housing 20, terminals are usually adapted to be screwed, soldered, pressed or welded to bus bars or to printed circuit boards (PCBs).

In one embodiment, the plastic housing 20 can be filled with a silicon gel or any other soft insulating material for protecting the semiconductor devices 10 against adverse environmental influences. The housing 20 also serves as a support for the terminals 21 and 22 against mechanical stress and vibration. Power electronic circuits are exposed to intermittent operation or to operation with varying load. This results in a variation of power losses over time and related temperature cycles. Temperature cycles can also be caused by changes in ambient conditions, i.e. the temperature of the air or the liquid cooling the heat-sink may change during operation. Due to thermo-mechanical expansion, thermo-mechanical stress is induced in the interfaces of the power semiconductors chips 10, the substrates (15, 16) and the base plate 17, thus exposing material interconnections, e.g. wire bonds or solder connections, to a cyclic thermo-mechanical load.

Figure 4:
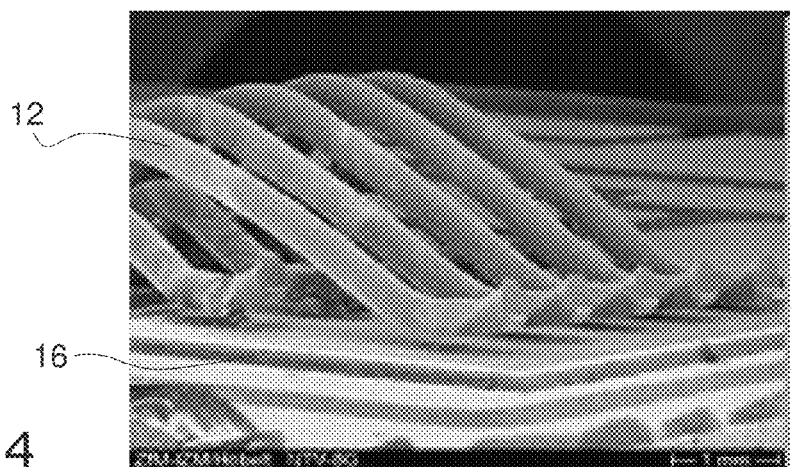
FIG. 4 shows bonding wire lift-off due to crack propagation in the bond wire.
Figure 5:
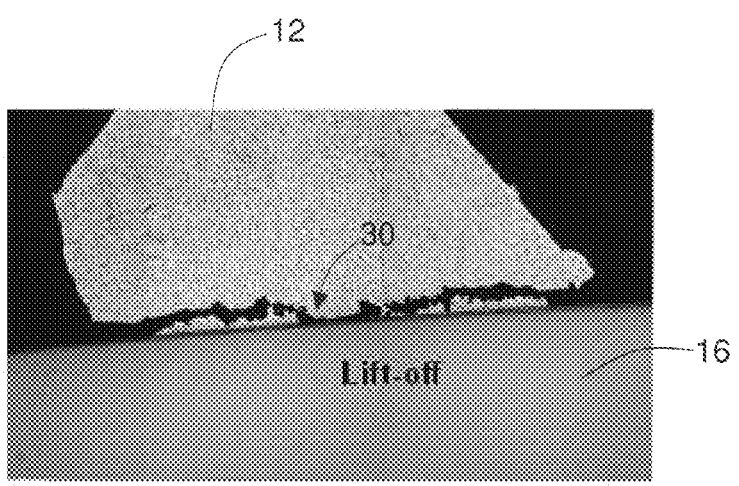
FIG. 5 is a cross-sectional view of a bonding wire with a crack.

The power-cycling and temperature-cycling capability of power semiconductor modules are today limited by solder fatigue and wire-bond lift-off. The effect of wire-bond lift-off is shown in FIGS. 4 and 5. Temperature cycles facilitate the propagation of micro-cracks 30 through the bond-wire 12 along the surface of the metallization layer 16 on which the wire 12 is bonded. Especially heavy bonding wires with diameters ranging from 100 μm to 600 μm necessary to conduct high currents to and from the semiconductor chips 11 are subject to crack propagation and bond lift-off effects. By now, semiconductor modules are able to withstand thermo-mechanic stress for the expected lifetime if they are operated below junction temperatures from 125° C. to 150° C. Recent development in power electronics, especially related to automotive applications like hybrid electric vehicles, require junction temperatures of up to 175° C. or even 200° C. within the power semiconductor chips.

Notwithstanding the above mentioned drawbacks, ultrasonic wire-bonding with its well known flexibility and precision is an attractive process for the top-side contact of semiconductor chips. As copper has better material characteristics, i.e. a lower coefficient of thermal expansion (CTE), higher mechanical strength with respect to crack propagation, twice the electrical and thermal conductivity, copper based material is used for improved wire-bonds connecting the semiconductor chip with the substrate.

However, thick wires which are typical for power semiconductor applications are difficult to apply with power semiconductor chips when copper wires are used. The problem is that compared to aluminum the harder copper wire would damage the structure below a bond-pad when bonding on an active area. To achieve a sufficiently large bonding-area it is necessary to ramp the bonding force from a low bonding force during the cleaning and the interconnection-phase to high bonding force during the deformation phase. This leads to high stress inside the semiconductor metallization layer 16 and can easily lead to damage or even destruction of the active area below the bond tool. With stronger wire materials which have higher tensile strength the risk of damage and destruction of the semiconductor structure below even rises.

Figure 6:
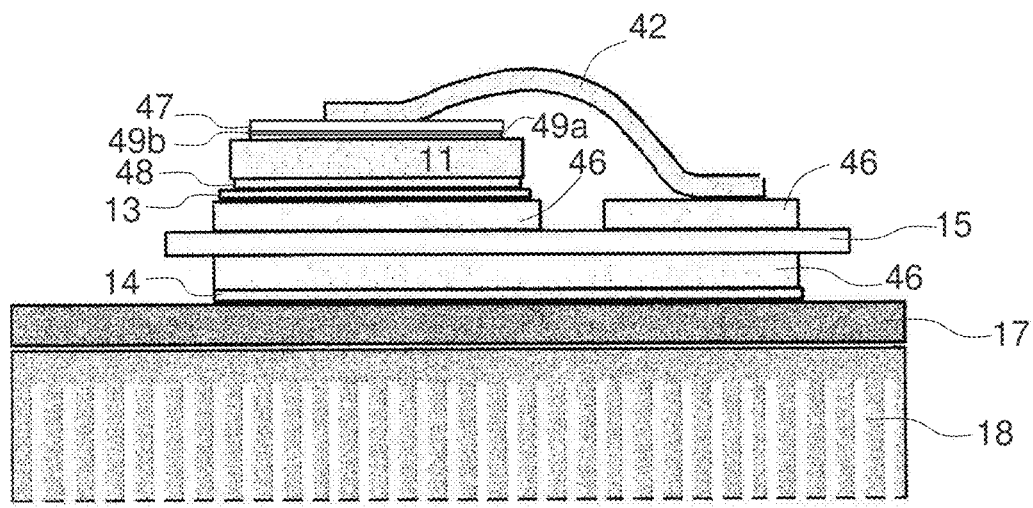
FIG. 6 shows an example of a semiconductor device soldered to a substrate, wherein copper-bonding wires are bonded on a thick-metal-layer.

FIG. 6 shows a part of an embodiment of a novel semiconductor module with the semiconductor chip 11 comprising a thick metal layer 47 deposited on a first surface of the semiconductor chip 11 wherein a thin electrically conductive and, as the case may be, thermally conductive adhesion layer 49a made of Ti, Ti/TiN, Ta, TaN, Ta/TaN, W, Ti/W, VaTi, VTiW, VTiN, Al/Ti/W, CrNi, CrVTi or other combinations out of these may be arranged between the semiconductor chip 11 and the thick metal layer 47. The thick metal layer 47 is thick enough and has an electrical and thermal conductivity high enough for current spreading on the chip and for spreading heat as well. Heavy copper wires 42 with diameters ranging from 300 μm up to 1 mm or copper ribbons with a minimal thickness of 200 μm and a width of 1 mm are bonded to the semiconductor chip 11 via the thick metal layer 47.

In an embodiment, the chip 11 has thick metal layers 47 and 48 of the same kind on both sides, i.e. a thick metal layer 47 on the top side for wire bonding and another thick metal layer 48 on the bottom side for soldering or sintering with a low temperature joining technique or for welding with a diffusion welding technique. In other embodiments, another adhesion layer 49a between the chip 11 and the thick metal layer 48 can be arranged on the bottom side of the chip. In some embodiments, the thick metal layers 47 and 48 may have thin protection layers (not explicitly shown in the figures for the sake of simplicity) on top to prevent oxidation or to ensure soldering ability. In other embodiments, additionally or alternatively barrier layers 49b can be arranged between the thick metal layers 47, 48 and the silicon body for inhibiting diffusion of metal from thick metal-layer 47 into the silicon body.

An exemplary thick metal layer 47 is at least 10 μm on at least one side of the silicon body each, whereas the total thickness of the aforementioned adhesion-layer 49a and the barrier-layer 49b is equal or less than 1 μm. The thick metal layer may comprise copper or a copper alloy with an electrical conductivity of at least $4.4 \times 10^7$ Ωm and a thermal conductivity of at least 300 W/(mK). As an alternative to copper a metal-matrix-composite based on copper with a lower coefficient of thermal expansion than copper can be used. The ratio of the total thickness of the top and the bottom thick metal layers together and the thickness of the silicon body is between 0.1 and 1.

Another embodiment of a novel semiconductor module is shown in FIG. 6. It comprises a ceramic substrate (insulating plate 15) with a first and a second surface having a thick copper plating 46 at least at one of its surfaces. It further comprises one or more semiconductor chips 11 as described above which are arranged on the substrate, wherein copper wire bonds 42 connect the first thick metal layer 47 of the semiconductor chip 11 with the thick copper metallization 46 of the ceramic substrate 15. In one embodiment, the thickness of the ceramic substrate 15 ranges from 0.1 mm to 0.3 mm and the total thickness of the copper plating on the top side or the bottom side of the ceramic substrate 15 is at least 0.4 mm. in one embodiment, the ceramic substrate 15 is made of a material of high mechanical strength, e.g. $Al_2O_3$ with Zr-, Y-, Er-, Nb, or Nd-additives, or $Si_3N_4$. In one embodiment, the semiconductor chips 11 can be fixed to the substrate by soldering the thick metal layer 48 on the bottom side of the chip to the substrate.

One or more ceramic substrates 15 comprising each one or more semiconductor chips 11 are arranged on a base plate 17 for combining the ceramic substrates in one single semiconductor module. The base plate 17 is made of copper or a metal-matrix-composite. In one embodiment, the base plate 17 can be mounted on a heat sink 18 and usually acts as a bottom-cap of a plastic housing 20 covering the ceramic substrates 15.

Figure 7:
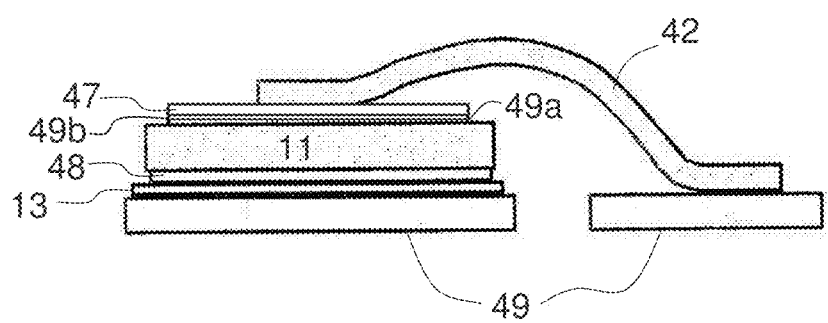
FIG. 7 shows the invention applied to a discrete device using the inventive chip and wire bonding structure.

FIG. 7 shows an embodiment of a semiconductor chip 11 with thick metal layers 47, similar to those of FIG. 6. The only difference is, that the chip is mounted to a lead-frame 50, i.e. on the metal frame which includes the leads of a plastic package for the semiconductor chip, instead to a ceramic substrate. This embodiment may be more suitable for discrete power semiconductors.

Figure 8:
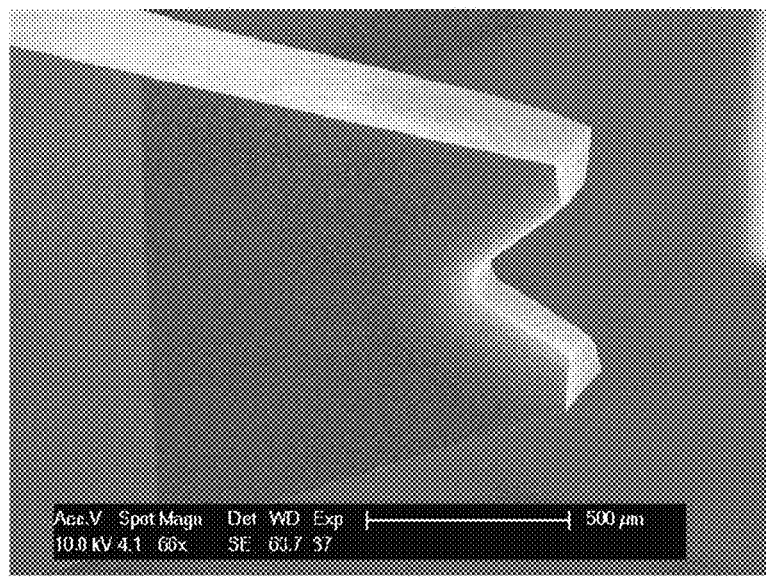
FIG. 8 shows a bonding tool with a micro porous coating at the groove for wire bonding copper wires.
Figure 9:
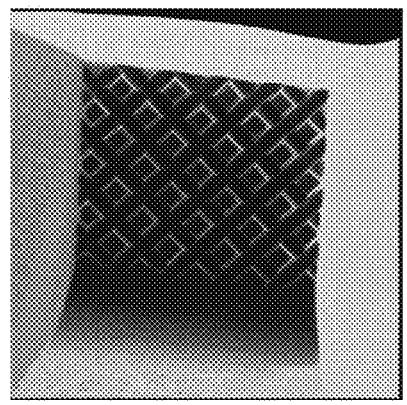
FIG. 9 shows a bonding tool with waffle-structure for ribbon bonding.
Figure 10:
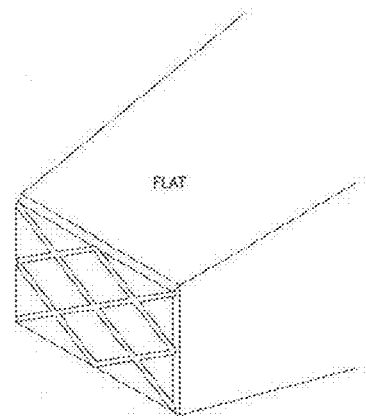
FIG. 10 shows a bonding tool with protrusion-structure.
Figure 10:
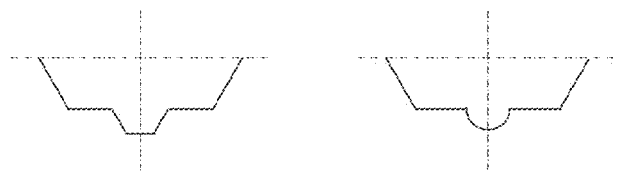

FIGS. 8, 9 and 10 show embodiments of different bonding tools for bonding thick copper wires. Using such bonding tools the ultrasonic power can be strongly reduced due to the fact that the tool surface which is in contact with the wire has a micro porous coating. Such bonding tool is shown in FIG. 8 and transfers the ultrasonic power reproducible to the wire and therefore also to the semiconductor device. Further applicable tools for bonding ribbons and wires have protrusion-structures as shown in FIG. 10 or waffle-structures as shown in FIG. 9. With the novel bonding-method, during the cleaning phase and the initial bonding phase the ultrasonic power is chosen very high (e.g. 80% of final ultrasonic power) at low bonding-load (e.g. 50% of final load). Then, the bonding-force is ramped up during the subsequent deformation-phase for around 10% of the bonding time. Subsequently, ultrasonic force and power are kept constant. This ensures a robust and reproducible interconnection with the complete bonding area below the bond. Furthermore an active wire clamping system is employed to ensure a reproducible loop forming.

In one embodiment, for a proper bond-interconnection the thick metallization layer 47 should be as hard as or slightly harder than the material of the bonding wire 42. Then the wire 42 will not penetrate the metallization too deeply, such minimizing the risk of damaging or destroying the barrier layer below the thick metallization layer 46. In one embodiment, to apply more current can be applied to the same area of a semiconductor chip. Moreover, the generated heat will be spread by the high thermally conductive thick metallization layer.

What is claimed is:

1. A semiconductor arrangement comprising:
    a silicon body having a top surface and a bottom surface;
    a thin electrically conductive adhesion layer deposited on the top surface of said silicon body;
    a thick metal layer arranged on the thin electrically conductive adhesion layer, said thick metal layer having a bonding surface facing away from the top surface of said silicon body;
    a bonding wire having a diameter of at least 300 micrometers (μm) or a bonding ribbon having a thickness of at least 200 micrometers (μm) bonded to said thick metal layer at the bonding surface of said thick metal layer; and
    wherein the thickness of said thick metal layer is at least 10 micrometers (μm), said thick metal layer comprises copper or a copper alloy, and said bonding wire or bonding ribbon comprises copper or a copper-based material.

2. The arrangement according to claim 1, further comprising a barrier-layer disposed between said thick metal-layer and said silicon body for inhibiting diffusion of metal from said thick metal layer into said silicon body.

3. The arrangement according to claim 2, wherein the total thickness of said thick metal-layer is 20 micrometers (μm).

4. The arrangement according to claim 2, wherein the total thickness of said adhesion-layer and said barrier-layer is equal or less than 1 micrometers (μm).

5. The arrangement according to claim 1, wherein the thick metal-layer has an electrical conductivity of at least $4.4 \cdot 10^7$ ohm meters (Ωm).

6. The arrangement according to claim 1, wherein the thick metal-layer has a thermal conductivity of at least 300 watts per Kelvin per meter ($W\ m^{-1}\ K^{-1}$).

7. The arrangement according to claim 1, wherein the thick-metal layer comprises a first thick-metal layer and the arrangement includes a second thick metal-layer arranged on the bottom surface of said silicon body, the ratio of the total thickness of said first and second thick metal-layers and the thickness of said silicon body is between 0.1 and 1.

8. A semiconductor arrangement comprising:
    a silicon body having a top surface and a bottom surface;
    a thick metal layer arranged on the top surface of said silicon body, said thick metal layer having a bonding surface facing away from the top surface of said silicon body;
    a bonding wire or a ribbon bonded to said thick metal layer at the bonding surface of said thick metal layer, wherein the bonding wire has a thickness of at least 300 micrometers (μm) and the ribbon has a thickness of at least 200 micrometers (μm) and a width of at least 1 millimeter (mm); and
    wherein the thickness of said thick metal layer is at least 10 micrometers (μm), said thick metal layer comprises copper or a copper alloy, and said bonding wire or ribbon comprises copper or a copper-based material.

9. The arrangement according to claim 8, further comprising a thin electrically conductive adhesion layer deposited on at least one of said surfaces of said silicon body.

10. The arrangement according to claim 9, further comprising a barrier-layer disposed between said thick metal-layer and said silicon body for inhibiting diffusion of metal from said thick metal layer into said silicon body.

11. The arrangement according to claim 10, wherein the total thickness of said thick metal-layer is 20 micrometers (μm).

12. The arrangement according to claim 10, wherein the total thickness of said adhesion-layer and said barrier-layer is equal or less than 1 micrometers (μm).

13. The arrangement according to claim 8, wherein the thick metal-layer has an electrical conductivity of at least $4.4 \cdot 10^7$ ohm meters ($\Omega$m).

14. The arrangement according to claim 8, wherein the thick metal-layer has a thermal conductivity of at least 300 watts per Kelvin per meter (W m$^{-1}$ K$^{-1}$).

15. The arrangement according to claim 8, wherein the thick-metal layer comprises a first thick-metal layer and the arrangement includes a second thick metal-layer arranged on the bottom surface of said silicon body, the ratio of the total thickness of said first and second thick metal-layers and the thickness of said silicon body is between 0.1 and 1.

* * * * *